(12) United States Patent
Koyanagi

(10) Patent No.: US 6,486,815 B1
(45) Date of Patent: Nov. 26, 2002

(54) OVERSAMPLING CIRCUIT AND DIGITAL/ANALOG CONVERTER

(75) Inventor: Yukio Koyanagi, Saitama (JP)

(73) Assignee: Yasue Sakai, Urawa (JP)

(*) Notice: Subject to any disclaimer, the term of this patent is extended or adjusted under 35 U.S.C. 154(b) by 0 days.

(21) Appl. No.: 09/890,537
(22) PCT Filed: Dec. 15, 2000
(86) PCT No.: PCT/JP00/08901
§ 371 (c)(1),
(2), (4) Date: Jul. 31, 2001
(87) PCT Pub. No.: WO01/45268
PCT Pub. Date: Jun. 21, 2001

(30) Foreign Application Priority Data

Dec. 17, 1999 (JP) .......................................... 11-360053

(51) Int. Cl.[7] ................................................. H03M 1/66
(52) U.S. Cl. ........................................ 341/144; 341/118
(58) Field of Search .............................. 341/144, 118, 341/120; 340/347

(56) References Cited

U.S. PATENT DOCUMENTS 4,167,731 A * 9/1979 Eggermont ................. 340/347
5,389,925 A * 2/1995 Ohga et al. ................. 341/108

FOREIGN PATENT DOCUMENTS

| JP | 63-108237 | 7/1988 |
| JP | 4-61509 | 2/1992 |
| WO | 99/38090 | 7/1999 |

* cited by examiner

Primary Examiner—Peguy Jeanpierre
Assistant Examiner—Joseph J Lauture
(74) Attorney, Agent, or Firm—Dellett & Walters

(57) ABSTRACT

It is object to provide an oversampling circuit and a digital to analog converter capable of realizing a smaller circuit and reducing a cost of parts. The oversampling circuit comprises multiplying section 1, four data holding sections 2-1 through 2-4, four data selectors 3-1 through 3-4, an adding section 4, and two integrating circuits 5-1 and 5-2. Input data is multiplied by four multiplicators by the multiplying section 1, and four multiplication results held, as one set, in the data holding sections. The data selectors read out the data held in the four data holding sections in a predetermined order and generate step function data. The adding section adds the values of four step functions outputted from the respective data selectors, and then digital integrating operations corresponding to the sum are carried out by means of two integrating circuits.

9 Claims, 8 Drawing Sheets

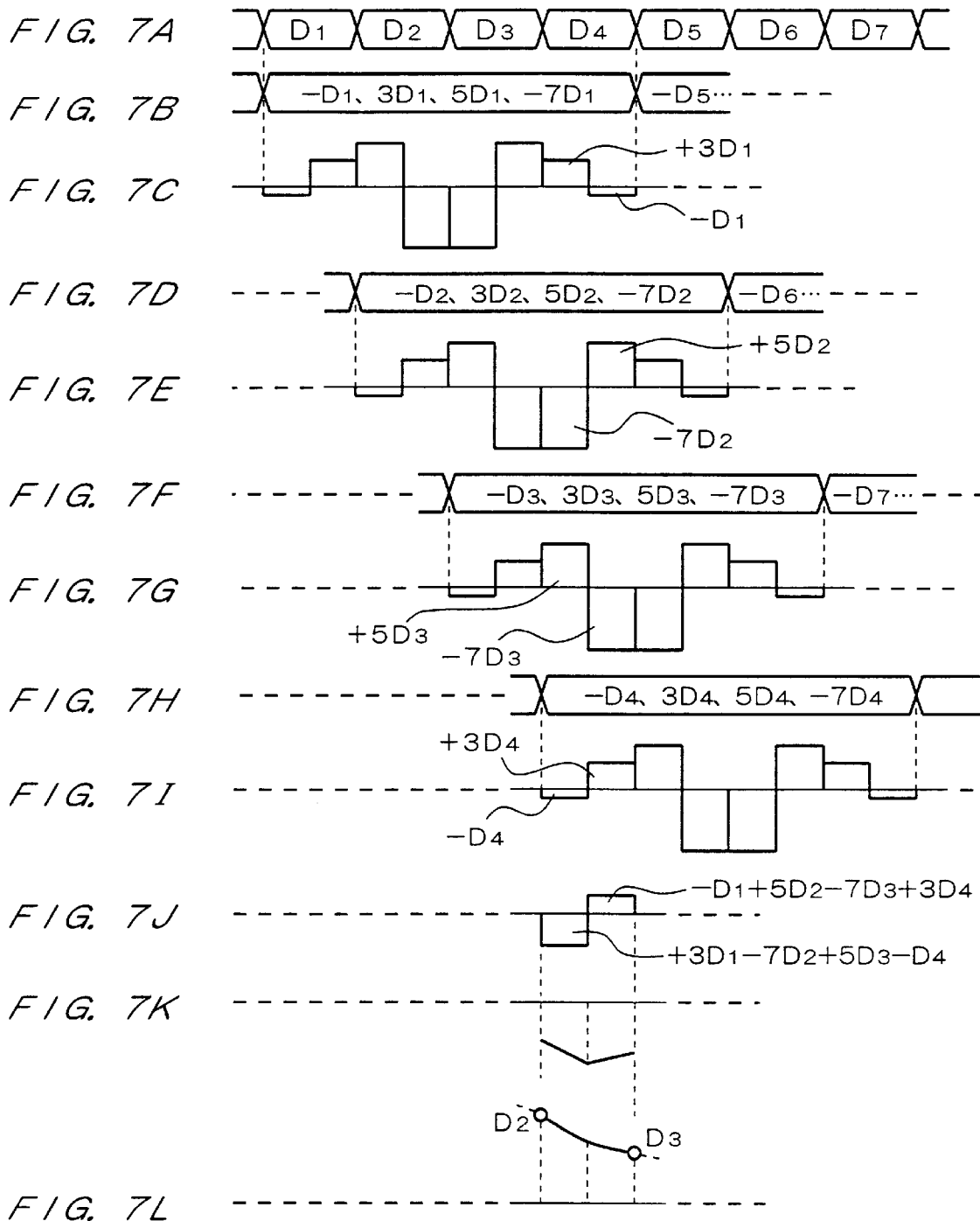

OVERSAMPLING CIRCUIT AND DIGITAL/ANALOG CONVERTER

TECHNICAL FIELD

The present invention relates to an over sampling circuit for interpolating input data discretely and a digital-to-analog converter to which the oversampling circuit is applied. In this specification, it is assumed that a case where function values have finite values except zero in a local region and become zero in regions different from the region is called a "local support."

BACKGROUND ART

A recent digital audio apparatus, for example, a CD (Compact Disk) player, uses a D/A (digital-to-analog) converter to which an over-sampling technique is applied to obtain a continuous analog audio signal from discrete music data (digital data). Such a D/A converter generally uses a digital filter to raise a pseudo sampling frequency by interpolating input digital data, and outputs smooth analog audio signals by passing each interpolation value through a low-pass filter after generating a staircase signal waveform with each interpolation value held by the sample holding circuit.

A data interpolation system disclosed in WO99/38090 is well known as a method of interpolating data into discrete digital data. In this data interpolation system, differentiation can be performed only once in the whole range, and a sampling function is used such that two sampling points each before and after an interpolation position, that is, a total of four sampling points, can be considered. Since the sampling function has values of a local support unlike the sinc function defined by sin (πft)/(πft) where f indicates a sampling frequency, there is a merit that no truncation errors occur although only four pieces of digital data are used in the interpolating operation.

Generally, oversampling is performed by using a digital filter in which the waveform data of the above mentioned sampling function is set to a tap coefficient of an FIR (finite impulse response) filter.

If the oversampling technology of performing an interpolating operation for discrete digital data using the above mentioned digital filter, a low pass filter having a moderate attenuation characteristic can be used. Therefore, the phase characteristic with a low pass filter can approach a linear phase characteristic, and the sampling aliasing noise can be reduced. These effects are more out standing with a higher oversampling frequency. However, if the sampling frequency becomes higher, the number of taps of the digital filter is also increased. As a result, there arises the problem of a larger circuit. In addition, the performance of the delay circuit or multiplier comprises the digital filter is also sped up. Therefore, it is necessary to use expensive parts appropriate for the quick performance, thereby increasing the cost of the required parts. Especially, when the oversampling process is performed using a digital filter, an actual value of a sampling function is used as a tap coefficient. Therefore, the configuration of a multiplier is complicated, and the cost of the parts furthermore increases.

Moreover, although a digital-to-analog converter can be configured by connecting a low pass filter after the oversampling circuit, the above mentioned various problems with the conventional oversampling circuit have also occurred with the digital-to-analog converter configured using the circuit.

BRIEF SUMMARY OF THE INVENTION

The present invention has been achieved to solve the above mentioned problems, and aims at providing an oversampling circuit and a digital-to-analog converter having a smaller circuit at a lower cost of parts.

In the oversampling circuit according to the present invention, a multiplying unit performs a plurality of multiplying processes using plural multiplicators on a plurality of digital data input at predetermined intervals, and using the plurality of multiplication result, step function is generated corresponding to each inputted digital data. By performing digital integration plural times on the addition results obtained by addition unit adding up values of the step function corresponding to each digital data, digital data whose values change stepwise is output along a smooth curve. Thus, the values of step function corresponding to sequentially input plural pieces of digital data are added up, and then the digital integration is performed on the addition result. As a result, output data whose values smoothly change can be obtained. Therefore, when an oversampling frequency is high, it is necessary only to speed up the digital integration, thereby avoiding the conventional complicated configuration, that is, simplifying the configuration, and reducing the cost of parts.

Each of the multiplicators used in the multiplying processes by the multiplying unit is desired to correspond to each of the values of step functions obtained by differentiating plural times piecewise polynomials for a predetermined sampling function configured by the piecewise polynomials. That is, by integrating plural times the above mentioned step function, a waveform corresponding to the predetermined sampling function can be obtained. Therefore, a convolution operation using a sampling function can be equivalently realized by generating a step function. As a result, the contents of the entire process can be simplified, and the number of processes required oversampling can be successfully reduced.

In addition, the above mentioned step function is desired to equally set the positive and negative areas. Thus, the divergence of integration results of the integrating unit can be prevented.

Furthermore, it is desirable that the above mentioned sampling function has a value of local support with the whole range differentiable only once. It is assumed that a natural phenomenon can be approximated if the whole range is a differentiable only once. By setting a smaller number of times of differentiation, the times of the digital integration performed by the integrating unit can be reduced, thereby successfully simplifying the configuration.

It is further desirable that the above mentioned step function contains an area of eight piecewise sections in equal width weighted by −1, +3, +5, −7, −7, +5, +3, and −1 in a predetermined range corresponding to five pieces of digital data arranged at equal intervals, and that the eight weight coefficients are set as the respective multiplicators of multiplying unit. Since simple weight coefficients represented by integers can be used as the multiplicators in the multiplying unit, the multiplying process can be simplified.

Especially, it is desirable that a multiplying process performed in the multiplying unit is represented by adding digital data to an operation result of the exponentiation of 2 by a bit shift. Since the multiplying process can be replaced with a bit shift process and an adding operation, the configuration can be simplified and the process can be sped up by simplifying the contents of the processes.

It is also desirable that the times of the digital integration is two, and a data whose value changes like a quadric function is output from the integrating unit. For smooth interpolating plural pieces of discrete data, it is necessary at least to change a value like a quadric function. Since it can be realized only by setting the number of times of the digital integration to 2, the configuration of the integrating unit can be simplified.

Furthermore, the digital integration performed by the integrating unit is a process of accumulating input data, and it is desirable that the process is repeated n times in a period of inputting digital data. Thus, the operation of accumulating data can be realized only by adding the input data. Therefore, the configuration of the integrating unit can be simplified, and the process can be easily and more quickly repeated. As a result, the value of the multiple n of the oversampling can be set to a large value without complicating the configuration and largely increasing the cost of parts.

In addition, the digital-to-analog converter can be configured only by providing voltage generation unit and smoothing unit at the stage after the above mentioned oversampling circuit. Accordingly, the digital-to-analog converter according to the present invention can be realized with a simplified configuration and reduced cost of parts. Furthermore, the above mentioned oversampling circuit can easily set a high oversampling frequency without complicating the configuration or largely increasing the cost of parts. As a result, the distortion of the output waveform of the digital-to-analog converter to which the oversampling circuit is applied can be minimized.

BRIEF DESCRIPTION OF THE DRAWINGS

FIGS. 7A through 7L are charts showing the operation timings of the oversampling circuit of an embodiment;

BEST MODE FOR CARRYING OUT THE INVENTION

Figure 1:
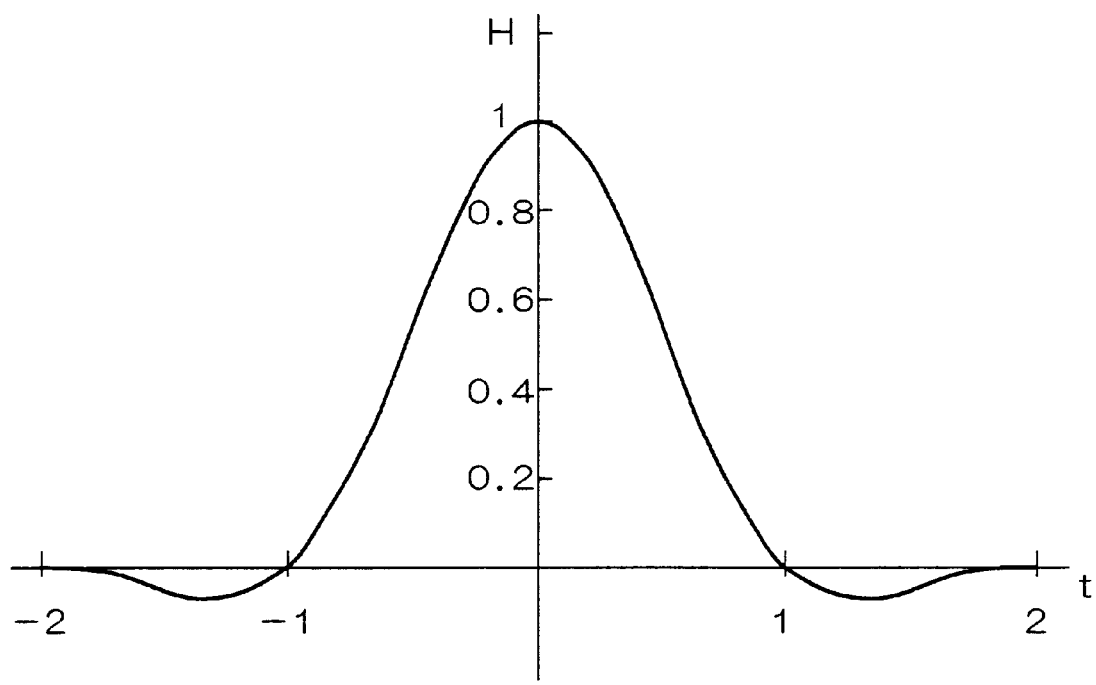
FIG. 1 is a diagram showing a sampling function used in an interpolating operation in the oversampling circuit according to an embodiment.

An embodiment of the oversampling circuit according to the present invention is described below in detail by referring to the attached drawings. FIG. 1 shows a sampling function used in an interpolating operation in the oversampling circuit according to the present embodiment. The sampling function H(t) is disclosed by WO99/38090, and represented by the following expressions.

$$
\begin{array}{ll}
(-t^2 - 4t - 4)/4 & ;-2 \leq t < -3/2 \\
(3t^2 + 8t + 5)/4 & ;-3/2 \leq t < -1 \\
(5t^2 + 12t + 7)/4 & ;-1 \leq t < -1/2 \\
(-7t^2 + 4)/4 & ;-1/2 \leq t < 0 \\
(-7t^2 + 4)/4 & ;0 \leq t < 1/2 \\
(5t^2 - 12t + 7)/4 & ;1/2 \leq t < 1 \\
(3t^2 - 8t + 5)/4 & ;1 \leq t < 3/2 \\
(-t^2 + 4t - 4)/4 & ;3/2 \leq t \leq 2 \ldots (1)
\end{array}
$$

where t=0 ±1, ±2 indicates the sampling position. The sampling function H(t) shown in FIG. 1 can be differentiated only once in the whole range, and is a function of local support converging into 0 with the sampling position t=±2. By performing an overlapping process using the sampling function H(t) based on each sampling value, the interpolating process can be performed using a function differentiable only once in the sampling values.

Figure 2:
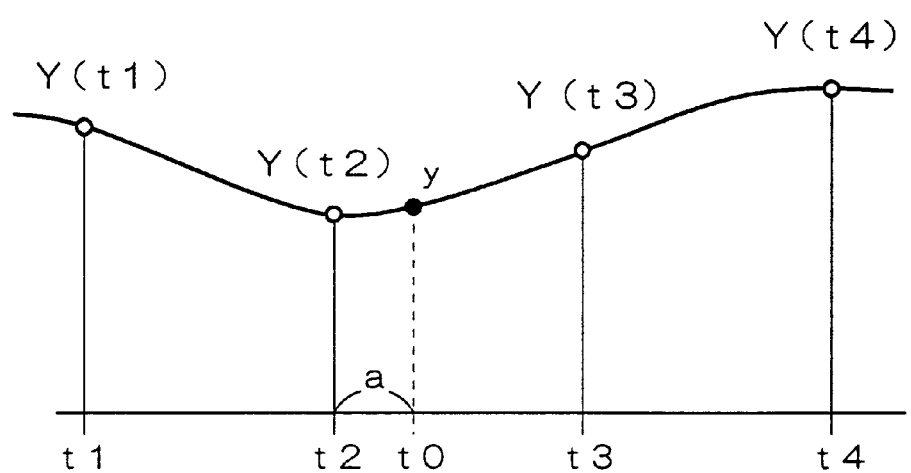
FIG. 2 is a diagram showing a relationship between the sampling values with an interpolation values.

FIG. 2 shows the relationship between the sampling values and the interpolation values. As shown in FIG. 2, assume that four sampling positions are t1, t2, t3, and t4, and the distance between two adjacent sampling positions is 1. The interpolation value y corresponding to the interpolation position t0 between the sampling positions t2 and t3 is obtained by the following equation.

$$y=Y(t1)\cdot H(1+a)+Y(t2)\cdot H(a) +Y(t3)\cdot H(1-a)+Y(t4)\cdot H(2-a) \qquad (2)$$

where Y(t) indicates each sampling value at the sampling position t. Each of 1+a, a, 1−a, and 2− a indicates the distance between the interpolation position t0 and each of the sampling positions t1 through t4.

As described above, by performing a convolution operation by computing the value of the sampling function H(t) corresponding to each sampling value, an interpolation value of sampling values can be obtained theoretically. However, the sampling function shown in FIG. 1 is a quadric piecewise polynomial differentiable only once in the whole range. Using this feature, the interpolation value can be obtained in another equivalent process procedure.

Figure 3:
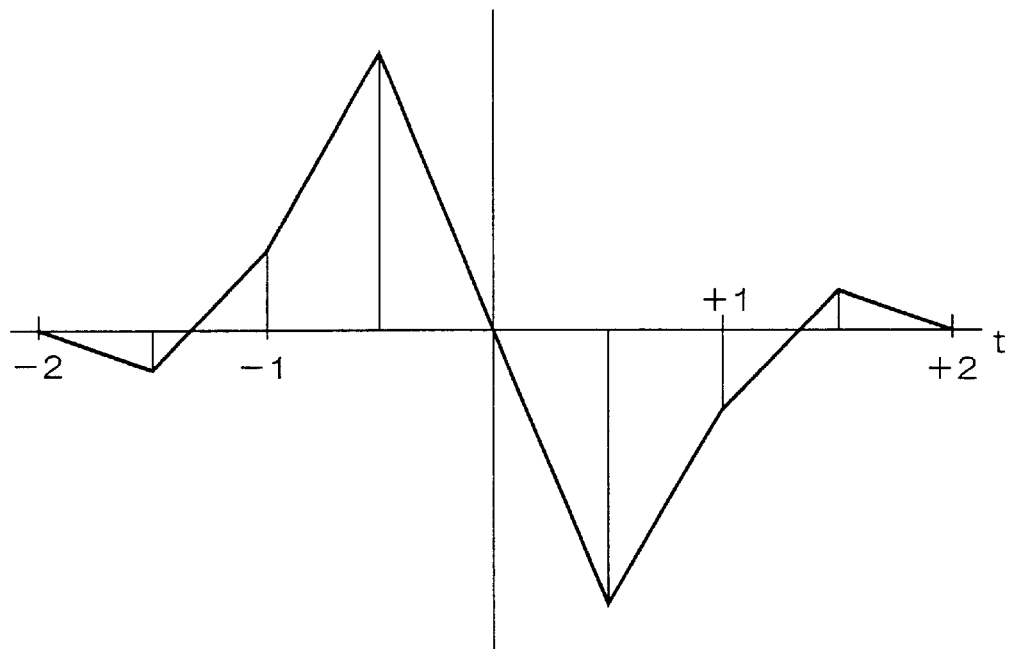
FIG. 3 is a diagram showing a waveform obtained by differentiating once the sampling function shown in FIG. 1.

FIG. 3 shows a waveform obtained by differentiating once the sampling function shown in FIG. 1. The sampling function H(t) shown in FIG. 1 is a quadric piecewise polynomial differentiable once in the entire range. Therefore, by performing the differentiation once, a polygonal line function formed by the waveform of a continuous polygonal line as shown in FIG. 3 can be obtained.

Figure 4:
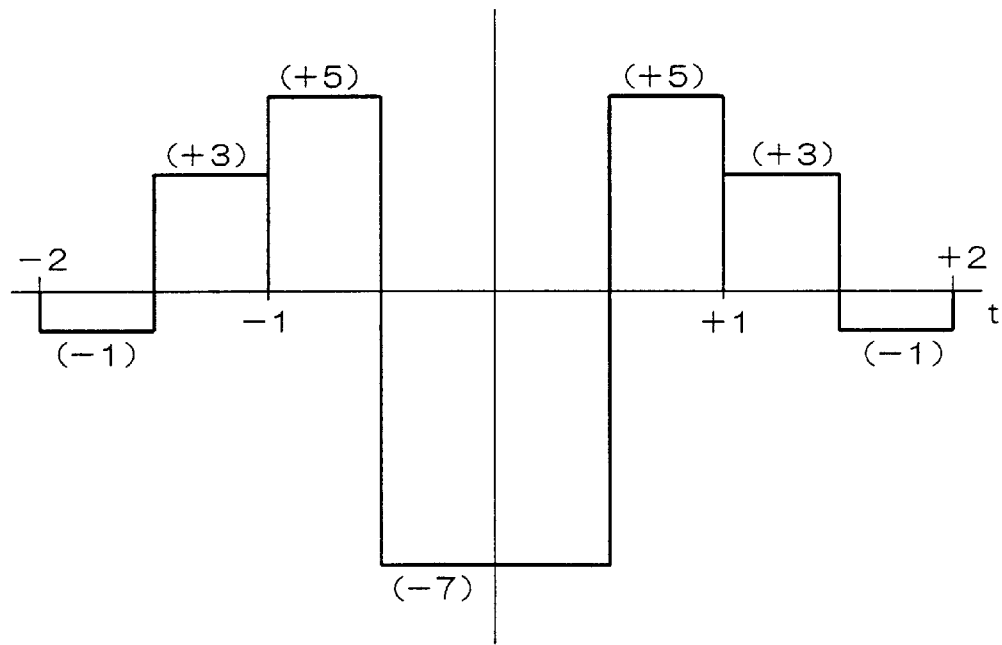
FIG. 4 is a diagram showing a the waveform obtained by further differentiating the polygonal line function shown in FIG. 3.

FIG. 4 shows the waveform obtained by further differentiating the polygonal line function shown in FIG. 3. However, the polygonal line waveform contains a plurality of corner points, and the differentiation cannot be performed in the whole range. Therefore, the differentiation is performed on the linear portion between two adjacent corner points. By differentiating the polygonal line waveform shown in FIG. 3, the step function formed by the stepwise waveform as shown in FIG. 4 can be obtained.

Thus, the above mentioned sampling function H(t) is once differentiated in the entire range to obtain a polygonal line function. By further differentiating each of the linear portions of the polygonal line function, a step function can be obtained. Therefore, in the reverse order, by generating the step function shown in FIG. 4, and integrating it twice, the sampling function H(t) shown in FIG. 1 can be obtained.

In the step function shown in FIG. 4, the positive and negative areas are set equal to each other, and the sum of the areas equals 0. That is, by integrating such a step function plural times, a sampling function of local support, as shown in FIG. 1, whose differentiability in the whole range is guaranteed can be obtained.

In computing the interpolation value in the convolution operation shown by the equation (2), the value of the sampling function H(t) is multiplied by each sampling value. If the sampling function H(t) is obtained by integrating twice the step function shown in FIG. 4, the value of the sampling function obtained in the integrating process is multiplied by each sampling value, or equivalently, when a step function before the integration processing is generated, an interpolation value can be obtained by generating a step function by multiplication by each sampling value, and performing twice the integrating process on the result obtained in the convolution operation using the step function. The oversampling circuit according to the present embodiment obtains an interpolation value as described above. This process is described below in detail.

Figure 5:
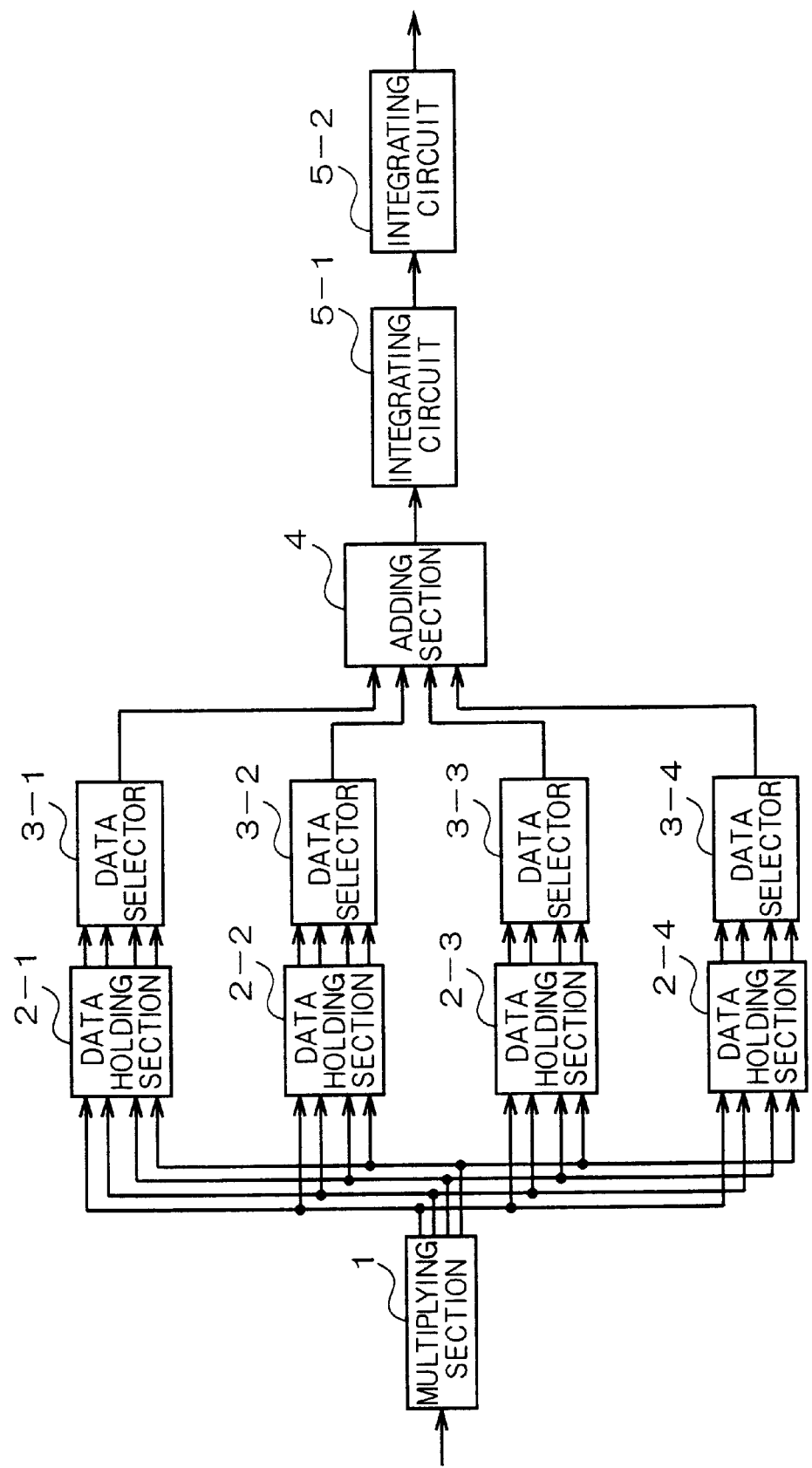
FIG. 5 is a diagram showing a the configuration of an oversampling circuit of an embodiment.

FIG. 5 shows the configuration of the oversampling circuit according to the present embodiment. The oversampling circuit shown in FIG. 5 comprises a multiplying section 1, four data holding sections 2-1, 2-2, 2-3, and 2-4, four data selectors 3-1, 3-2, 3-3, and 3-4, an adding section 4, and two integrating sections 5-1, 5-2.

The multiplying section 1 outputs a result of multiplying discrete digital data sequentially input at predetermined time intervals by a multiplicator corresponding to each value of the step function shown in FIG. 4. Each value of the step functions shown in FIG. 4 can be obtained by twice differentiating each piecewise polynomial of the above mentioned equation (1) as follows.

$$\begin{array}{ll} -1; & -2 \leq t < -3/2 \\ +3; & -3/2 \leq t < -1 \\ +5; & -1 \leq t < -1/2 \\ -7; & -1/2 \leq t < 0 \\ -7; & 0 \leq t < 1/2 \\ +5; & 1/2 \leq t < 1 \\ +3; & 1 \leq t < 3/2 \\ -1; & 3/2 \leq t \leq 2 \end{array}$$

Therefore, the multiplying section 1 multiplies the input data D by four types of the value corresponding to the above mentioned step functions as multiplicators (−1, +3, +5, and −7), when the data D is input, and concurrently outputs a set of four-piece data, that is, −D, +3D, +5D, and −7D.

The data holding sections 2-1 through 2-4 cyclically fetch a set of four-piece data output from the multiplying section 1, and hold the data until the next fetching timing. For example, a set of four-piece data output from the multiplying section 1 corresponding to the first input data is fetched and held in the data holding section 2-1, and a set of four-piece data output from the multiplying section 1 corresponding to the second input data is fetched and held in the data holding section 2-2. Similarly, each set of four-piece data output from the multiplying section 1 corresponding to the third and fourth input data is fetched and held in the data holding section 2-3, and 2-4, respectively. When a cycle of the data holding operation is completed in the data holding sections 2-1 through 2-4, then the next output data from the multiplying section 1 corresponding to the fifth input data is fetched and held by the data holding section 2-1 which has first held the data. Thus, sets of four-piece data sequentially output from the multiplying section 1 corresponding to the input data are cyclically held by the data holding sections 2-1, etc.

The data selectors 3-1 through 3-4 output data whose values change stepwise corresponding to a step function by sequentially reading four pieces of data held in the one-to-one corresponding to the data holding sections 2-1 through 2-4 in a predetermined order. Practically, for example, when four pieces of data (−D, +3D, +5D, and −7D) obtained by multiplying the data D by the above mentioned four types of multiplicators are held in the data holding section 2-1, the data selector 3-1 cyclically reads the held digital data in the order of −D, +3, +5D, −7D, −7D, +5D, +3D, and −D at predetermined time intervals, thereby outputting the data of step functions having a value proportional to the input data D.

The adding section 4 adds up digitally the values of the step functions output from four data selectors 3-1 through 3-4. The two serially connected integrating circuits 5-1 and 5-2 perform two integrating processes on the data output from adding section 4. A linearly changing data (like a linear function) is output from the integrating circuit 5-1 at the first stage, and a data changing like a quadric function is output from the integrating circuit 5-2 at the subsequent stage.

Figure 6:
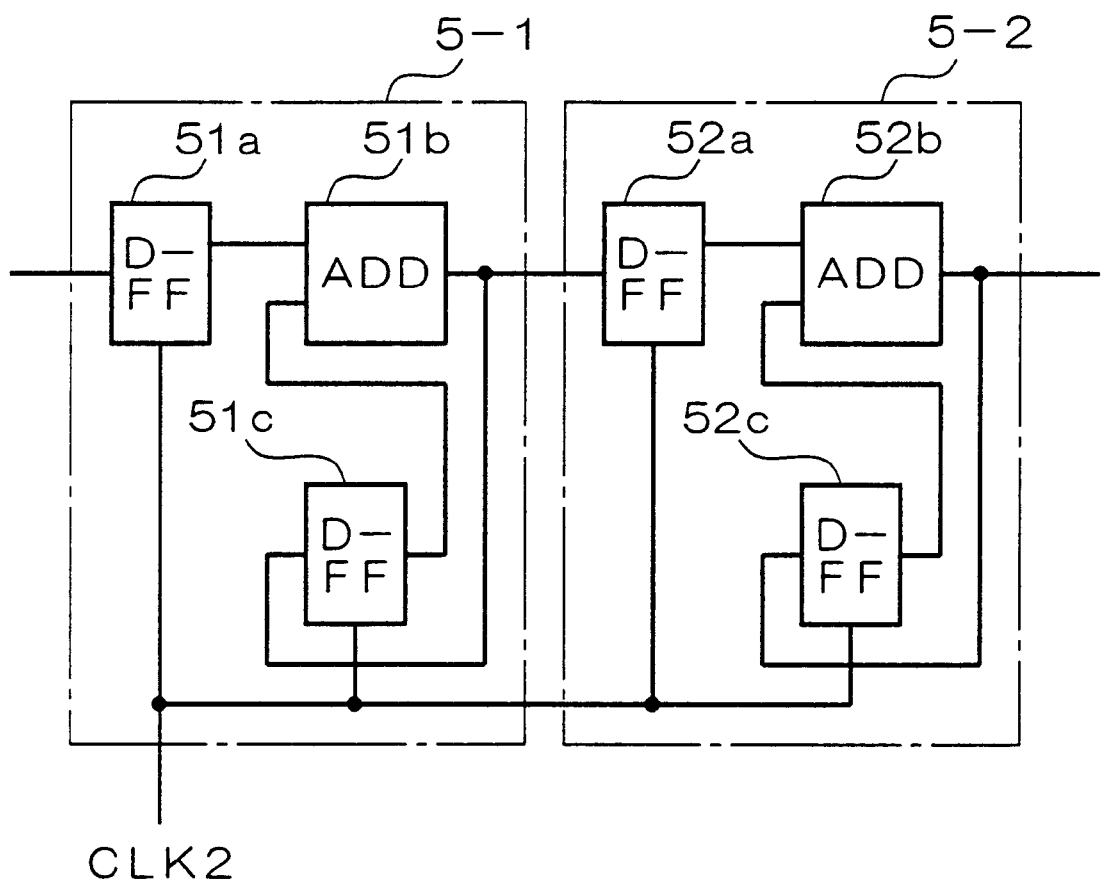
FIG. 6 is a block diagram showing a detailed configuration of an integrating circuit included in the oversampling circuit shown in FIG. 5.

FIG. 6 shows the detailed configuration of the integrating circuits 5-1 and 5-2. The integrating circuit 5-1 at the preceding stage comprises two D flip-flops (D-FF) 51a and 51c and an adder (ADD) 51b. The adder 51b has two input terminals. Data output from the adding section 4 and temporarily held in the D flip-flop 51a is input into one input terminal, and data output from the adder 51b itself and temporarily held in the D flip-flop 51c is input into the other input terminal. Each of the D flip-flops 51a and 51c holds the data synchronous with the clock signal CLK2 for an integrating operation. The clock signal CLK2 corresponds to the oversampling frequency, and is set to the frequency n times as high as the frequency of the clock signal CLK synchronized with input timing of the input data. Therefore, when the data output from the adding section 4 is input into the integrating circuit 5-1 with the above mentioned configuration, a digital integrating operation for accumulating the input data is performed in synchronization with the clock signal CLK2.

The integrating circuit 5-2 at the subsequent stage has the basically the same configuration as the above mentioned integrating circuit 5-1 at the preceding stage, and comprises two D flip-flops (D-FF) 52a and 52c and an adder (ADD) 52b. When data output from the integrating circuit 5-1 at the preceding stage is input into the integrating circuit 5-2 with the above mentioned configuration, a digital integrating operation for accumulating the input data is performed in synchronization with the clock signal CLK2.

Since the value of the step function output from the above mentioned data selector 3-1 is proportional to the value of the digital data input to the multiplying section 1 at predetermined timing, the data output from the subsequent integrating circuits 5-2 by performing twice the integrating process on the value of the step function by the two integrating circuits 5-1 and 5-2 include the data corresponding to the multiplication result of the sampling function shown in FIG. 1 by the input data. Also, the adding section 4 adds up the values of the step functions output from data selectors 3-1 through 3-4. This can be equivalently performed by the convolution process using a step function as shown in FIG. 1, paying attention to an output data from the integrating circuit 5-2 at the subsequent stage.

Therefore, in the case of inputting digital data into the oversampling circuit according to the present embodiment at a predetermined time intervals, the outputting timing of data of the step function from each data selector is shifted corresponding to the input interval, and the step functions respectively generated are added up, then the adding results are performed the integrating operation twice, thereby obtaining digital data whose values change stepwise along the curve smoothly connecting digital data input at predetermined intervals.

The above mentioned multiplying section 1 corresponds to multiplying unit, the combinations of the data holding section 2-1, or the like, and the data selector 3-1, or the like correspond to the step function generation unit, the adding section 4 corresponds to the addition unit, and the integrating sections 5-1 and 5-2 correspond to integrating unit, respectively.

FIGS. 7A to 7L are charts showing the operation timings of the oversampling circuit in this embodiment. As shown in FIG. 7A, if the digital data $D_1$, $D_2$, $D_3$, ... are input at a constant time interval, each of the data holding sections 2-1 through 2-4 holds four data corresponding to these digital data $D_1$, $D_2$, $D_3$, ... cyclically. More specifically, the data holding section 2-1 fetches four data $-D_1$, $+3D_1$, $+5D_1$, $-7D_1$ output from the multiplying section 1 corresponding to the first input data $D_1$, and holds the data till the input digital data is circulated (or till four data corresponding to a fifth input data $D_5$ ($-D_5$, $+3D_5$, $+5D_5$, $-7D_5$) is input) (FIG. 7B). The data selector 3-1 reads out four data corresponding to the first input data $D_1$ in predetermined order, and generates a step function having a value proportional to the input data $D_1$ (FIG. 7C).

Similarly, the data holding section 2-2 fetches four data $-D_2$, $+3D_2$, $+5D_2$, $-7D_2$ output from multiplying section 1 corresponding to the second input data $D_2$, and holds the data till the input digital data is circulated (or till four data corresponding to a sixth input data $D_6$ is input) (FIG. 7D). The data selector 3-2 reads out four data corresponding to the second input data $D_2$ in predetermined order, and generates a step function having a value proportional to the input data $D_2$ (FIG. 7E).

The data holding section 2-3 fetches four data $-D_3$, $+3D_3$, $+5D_3$, $-7D_3$ output from multiplying section 1 corresponding to the third input data $D_3$, and holds the data till the input digital data is circulated (or till four data corresponding to a seventh input data $D_7$ is input) (FIG. 7F). The data selector 3-3 reads out four data corresponding to the third input data $D_3$ in predetermined order, and generates a step function having a value proportional to the input data $D_3$ (FIG. 7G).

The data holding section 2-4 fetches four data $-D_4$, $+3D_4$, $+5D_4$, $-7D_4$ output from multiplying section 1 corresponding to the fourth input data $D_4$, and holds the data till the input digital data is circulated (or till four data corresponding to a eighth input data $D_8$ is input) (FIG. 7H). The data selector 3-4 reads out four data corresponding to the fourth input data $D_4$ in predetermined order, and generates a step function having a value proportional to the input data $D_4$ (FIG. 7I).

The adding section 4 adds values of step functions output from each of four data selectors 3-1 through 3-4 in this way. By the way, the step function generated by each of the data selectors 3-1 through 3-4 as shown in FIG. 4 is a function of a local support having eight piecewise sections divided at every 0.5 from a region of the sample position $t=-2$ to $+2$ in which the sampling function of FIG. 1 has finite values. For example, a first piecewise section, a second piecewise section, ..., and an eighth piecewise section are defined in a direction from the sample position $t=-2$ to $+2$.

More specifically, the adding section 4 at first adds a value $(+3D_1)$ corresponding to the seventh piecewise section that is output from the data selector 3-1, a value $(-7D_2)$ corresponding to the fifth piecewise section that is output from the data selector 3-2, a value $(+5D_3)$ corresponding to the third piecewise section that is output from the data selector 3-3, and a value $(-D_4)$ corresponding to the first piecewise section that is output from the data selector 3-4 to output a result of addition $(+3D_1 -7D_2 +5D_3 -D_4)$.

Then, the adding section 4 adds a value $(-D_1)$ corresponding to the eighth piecewise section that is output from the data selector 3-1, a value $(+5D_2)$ corresponding to the sixth piecewise section that is output from the data selector 3-2, a value $(-7D_3)$ corresponding to the fourth piecewise section that is output from the data selector 3-3, and a value $(+3D_4)$ corresponding to the second piecewise section that is output from the data selector 3-4 to output a result of addition $(-D_1 +5D_2 -7D_3 +3D_4)$.

Thus, when addition results are sequentially output in the form of steps from the adding section 4 (FIG. 7J), the integrating circuit 5-1 at the preceding stage outputs plural pieces of data whose values change in the form of the polygonal line by integrating the data (FIG. 7K). The integrating circuit 5-2 at the subsequent stage further integrates the data whose values changes in the form of the polygonal line, and outputs plural pieces of data whose values change along a smooth curve differentiable only once between the input data $D_2$ and $D_3$ (FIG. 7L).

Figure 8A:
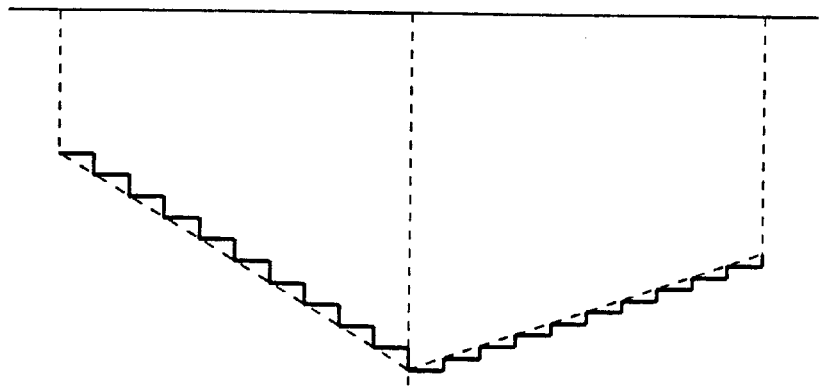
FIGS. 8A and 8B are diagrams showing detailed data output from the integrating circuits.
Figure 8B:
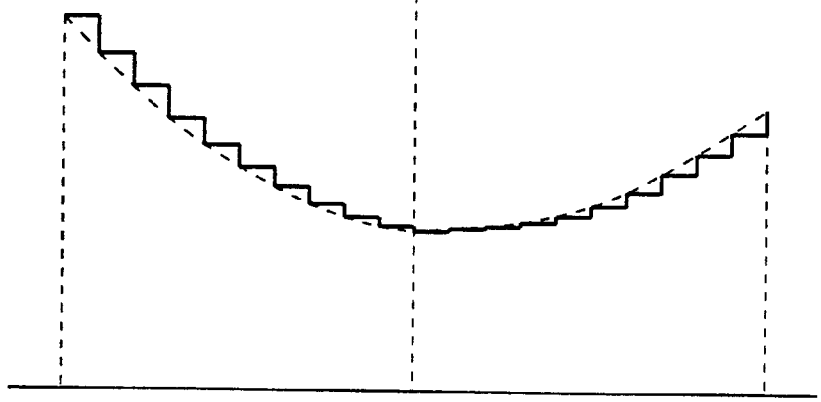

FIGS. 8A and 8B show the details of the data output from the two integrating circuits 5-1 and 5-2. For example, the frequency of the clock signal CLK2 for an integrating operation input into each of the integrating circuits 5-1 and 5-2 is set to 20 times as high as the sampling frequency (frequency of the clock signal CLK) of the input data. As shown in FIG. 8A, the plural pieces of data output from the integrating circuit 5-1 at the preceding stage have values changing like a linear function. As shown in FIG. 8B, the plural pieces of data output from the integrating circuit 5-2 at the subsequent stage have values changing like a quadric function.

In each of the integrating circuits 5-1 and 5-2 whose configurations are shown in FIG. 6, a digital integrating process is performed by simply accumulating input data. Therefore, since the value of the data output therefrom becomes larger depending on the multiple of the oversampling, it is necessary to provide a division circuit at the output stage of each of the integrating circuits 5-1 and 5-2 in order to make the values of input output data coincident. For example, in the example shown in FIG. 8, since the value of the output data is 20 times as large as the input data, a division circuit having a divisor of 20 is provided at the end of each of the integrating circuits 5-1 and 5-2. However, when a multiple of the oversampling is set to a value of the power of 2 (for example, 2, 4, 8, 16, ...), a dividing process can be performed on output data by bit-shifting the output data of each of the integrating circuits 5-1 and 5-2 toward lower bits, thereby omitting the above mentioned division circuit. For example, when the multiple of the oversampling is set to 16, the output data from each of the integrating circuits 5-1 and 5-2 can be shifted by 5 bits toward lower bits. Therefore, the wiring at the output terminal of each circuit can be shifted by 5 bits in advance.

Thus, the oversampling circuit according to the present embodiment holds the four multiplication results as a unit corresponding to each input digital data in the four data holding sections 2-1 through 2-4 cyclically. The data selectors 3-1 through 3-4 read out the four held data in predetermined order, thereby generating the step functions. Then, adding section 4 adds the values of the step function while corresponds to the four input data. And then, by performing a digital integrating process twice by the two integrating circuits 5-1 and 5-2 on the data output from the adding section 4, an oversampling process can be performed for increasing in a pseudo manner a sampling frequency n times as high as the frequency of each piece of the input digital data.

Especially, the oversampling circuit according to the present embodiment sets how many times the sampling frequency of the input data the oversampling frequency is to be set depends only on the frequency of the clock signal CLK2 input into the two integrating circuits 5-1 and 5-2. That is, the multiple of the oversampling can be set large only by configuring the two integrating circuits 5-1 and 5-2 using high-speed parts. Therefore, unlike the conventional method of performing the oversampling process using a digital filter, the entire circuit is not large although the frequency of the oversampling is set higher, thereby minimizing the increase of the cost of parts. Furthermore, the contents of the operations can be simplified by using the four multiplicators represented by integers in the multiplying process by the multiplying section 1, thereby simplifying the configuration of the multiplying section, and reducing the cost of parts.

Furthermore, for example, when an oversampling process is performed to obtain a pseudo frequency n times as high as the sampling frequency (for examples, 1024 times), it has been necessary in the conventional method to have the operation speed of the parts as high as the pseudo frequency. However, according to the oversampling circuit of the present embodiment, except the two integrating circuits, it is necessary to operate the each data holding sections and each data selector, etc. at the sampling frequency or the frequency twice as high as the sampling frequency, thereby considerably reducing the operation speed of each part.

Figure 9:
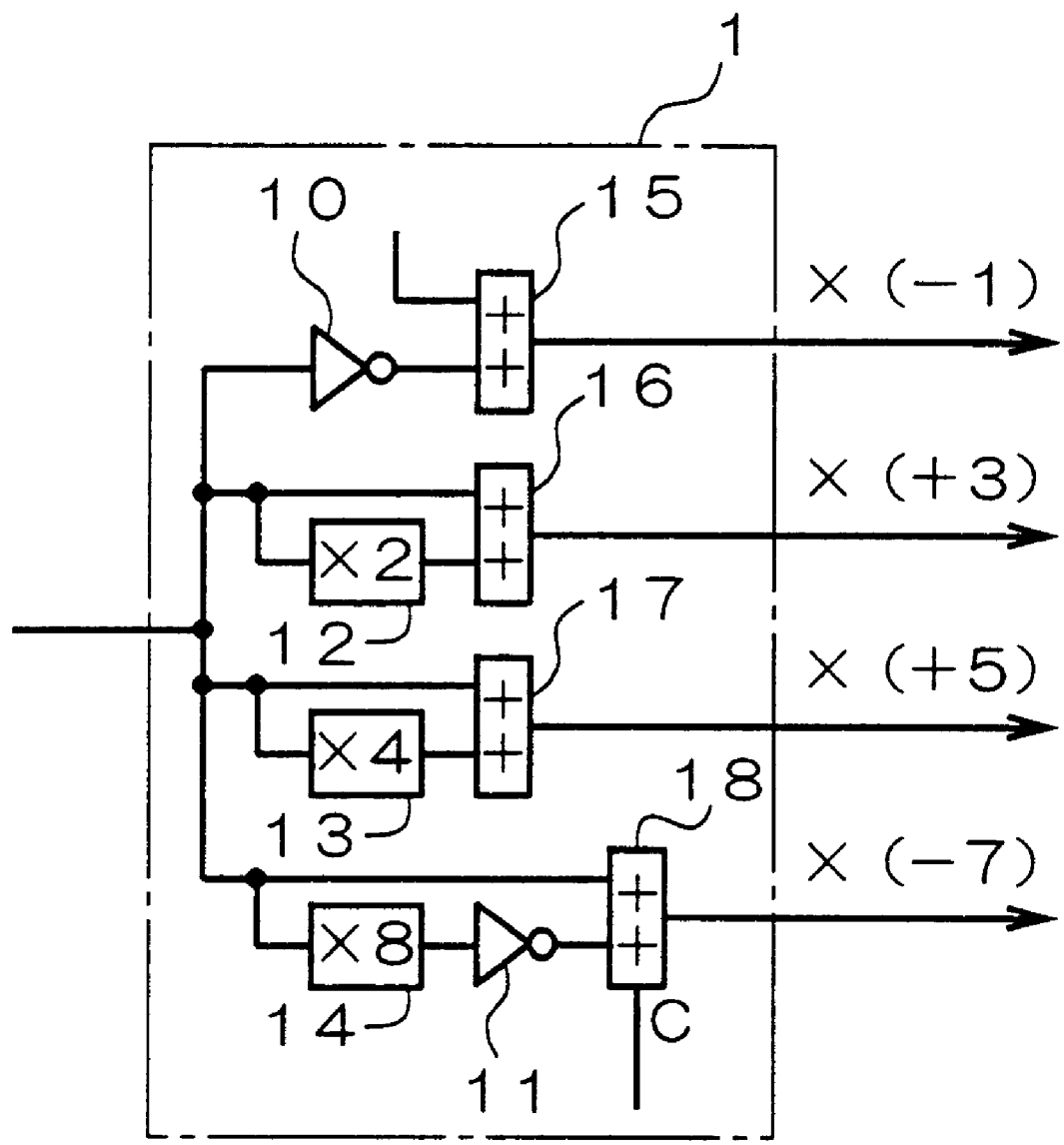
FIG. 9 is a diagram showing a detailed configuration of the multiplying section.

FIG. 9 shows the detailed configuration of the multiplying section 1 shown in FIG. 5. The multiplying section 1 shown in FIG. 9 comprises two inverters 10 and 11 for inverting the logic of each bit of the input data and outputting the result, a multiplier 12 for multiplying by the multiplicator of 2, a multiplier 13 for multiplying by the multiplicator of 4, a multiplier 14 for multiplying by the multiplicator of 8, and four adders 15, 16, 17, and 18.

For example, when data $D_1$ is input into the multiplying section 1 which has the configuration as mentioned above, the inverter 10 outputs the data obtained by inverting the logic of each bit of the input data $D_1$, the adder 15 adds 1 to the lowest bit of each piece of the output data, thereby obtaining the complement of the input data $D_1$. This equivalently shows the value $(-D_1)$ obtained by multiplying the input data $D_1$ by $-1$. Furthermore, the multiplier 12 outputs a value $(+2D_1)$ two times as large as the value of the input data $D_1$, and the adder 16 adds the original input data $D_1$ to the data, thereby obtaining the value $(+3D_1)$ three times as large as the input data $D_1$. Similarly, the multiplier 13 outputs a value $(+4D_1)$ four times as large as the input data $D_1$, and the adder 17 adds the value to the original input data $D_1$, thereby obtaining a value $(+5D_1)$ five times as large as the input data $D_1$. Additionally, the multiplier 14 outputs a value $(+8D_1)$ eight times as large as the input data $D_1$, the inverter 11 inverts the logic of each bit of the output data, and the adder 18 adds the original input data $D_1$ to the inverted data. The adder 18 has a valid carry terminal C, and adds 1 to the lowest bit of the output data of the inverter 11, thereby obtaining the complement of the output data of the inverter 11. Therefore, a value $(-7D_1)$ $-7$ times as large as the input data $D_1$ can be obtained by adding the original input data $D_1$ to the value $(-8D_1)$ $-8$ times as large as the input data $D_1$ by means of the adder 18.

Since the multiplicators are power of 2, the above mentioned three multipliers 12, 13, and 14 can perform the multiplying process only by performing bit shifting operation. Thus, by combining the multiplying process of the power of 2 by the bit shift with the adding process, the multiplying process is performed by four multiplicators, thereby simplifying the configuration.

Figure 10:
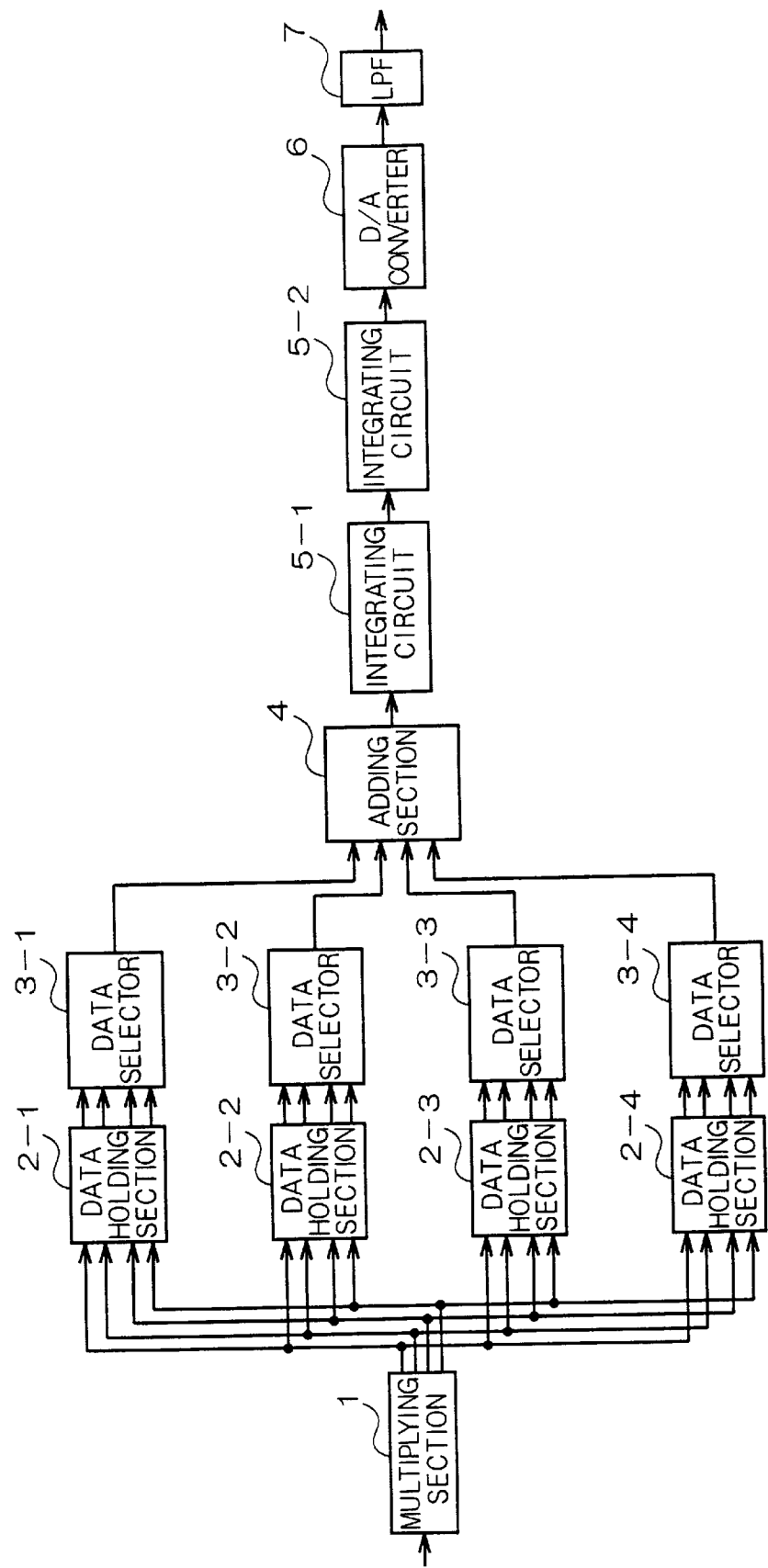
FIG. 10 is a diagram showing a configuration of the D/A converter to which the oversampling circuit shown in FIG. 5 is applied.

A D/A converter can be configured with smaller number of parts by adding a low pass filter, etc. at the subsequent stage of the above mentioned oversampling circuit. FIG. 10 shows the configuration of the D/A converter. The D/A converter has the configuration obtained by adding a D/A converter 6 and a low pass filter (LPF) 7 at the subsequent stage of the oversampling circuit shown in FIG. 5. The D/A converter 6 corresponds to the voltage generation unit, and the low pass filter 7 corresponds to the smoothing unit.

The D/A converter 6 generates an analog voltage corresponding to the stepwise digital data output by the integration circuit 5-2 at the subsequent stage. The D/A converter 6 generates a constant analog voltage proportional to the value of the input digital data, and the voltage value at the output terminal of the D/A converter 6 also changes stepwise. The low pass filter 7 smoothes the output voltage of the D/A converter 6, and outputs a smoothly changing analog signal.

Since the D/A converter shown in FIG. 10 uses the oversampling circuit shown in FIG. 5, the configuration can be simplified and the cost of parts can be reduced. Although an output waveform is obtained with less distortion and the oversampling frequency set high, the configuration is not complicated with reduced cost.

The present invention is not limited to the above mentioned embodiment, and various types of embodiments can be set within the scope of the gist of the present invention. For example, according to the above mentioned embodiment, a sampling function is defined as a function of local support differentiable only once in the whole range, but the times of differentiation can be set to a value equal to or larger than 2. In this case, the number of integrating circuits is to match the number of times of differentiation.

The sampling function of this embodiment converges to zero at t=±2, as shown in FIG. 1, but may converge to zero at t+3 or beyond. For example, in a case of the sampling function converging to zero at t=±3, six data holding sections and six data selectors may be contained in the oversampling circuit shown in FIG. 5, to interpolate for the six digital data.

Furthermore, it is not limited to the interpolating process using a sampling function of local support, but using a sampling function differentiable finite times having a predetermined value in the range from −∞ to +∞, an interpolation process may be performed only for plural digital data corresponding to finite sample position. For example, assuming that the sampling function is defined by a quadric piecewise polynomial, a predetermined step function can be obtained by twice differentiating each piecewise polynomial. Therefore, a convolution operation is performed using this step function, and an operation result is integrated twice, thereby performing an oversampling process.

INDUSTRIAL APPLICABILITY

As described above, according to the present invention, a plurality of multiplying processes are performed using plural multiplicators on a plurality of digital data input at predetermined intervals. Using the plurality of multiplication result, the step functions are generated corresponding to each input digital data. By performing digital integration plural times on the addition results obtained by adding up values of the step function corresponding to each input digital data, digital data whose values change stepwise is output along a smooth curve. Therefore, when an oversampling frequency is high, it is necessary only to speed up the digital integration, thereby avoiding the conventional complicated configuration, that is, simplifying the configuration, and reducing the cost of parts.

What is claimed is:

1. An oversampling circuit, characterized by comprising:
   a multiplying unit for performing a plurality of multiplying process using plural multiplicators on plural pieces of digital data inputted at a predetermined intervals;
   a data holding section for holding plural of multiplication result obtained by the multiplying unit;
   a plurality of step function generation unit for generating step functions corresponding to each of the plural pieces of digital data using plural of multiplication result from said data holding section synchronized with an input timing of each of the plural pieces of digital data;
   an addition unit for performing a process of adding up values of the step functions generated by the plurality of step function generation unit; and
   an integrating unit for performing a digital integrating process plural times on output data from the addition unit.

2. An oversampling circuit, characterized by comprising:
   a multiplying unit for performing a plurality of multiplying process using plural multiplicators on plural pieces of digital data inputted at a predetermined intervals;
   a plurality of step function generation unit for generating step functions corresponding to each of the plural pieces of digital data using plural of multiplication result obtained by the multiplying unit synchronized with an input timing of each of the plural pieces of digital data;
   an addition unit for performing a process of adding up values of the step functions generated by the plurality of step function generation unit; and
   an integrating unit for performing a digital integrating process plural times on output data from the addition unit,
   characterized in that each of the multiplicators used in the multiplying processes by the multiplying unit corresponds to each of the values of step functions obtained by differentiating plural times piecewise polynomials for a predetermined sampling function configured by the piecewise polynomials.

3. The oversampling circuit according to claim 2, wherein said step function comprises a positive region and a negative region set to have an equal area.

4. The oversampling circuit according to claim 3, wherein said sampling function is differentiable only once over the whole range and has values of local support.

5. The oversampling circuit according to claim 2, characterized in that said step function consists of eight piecewise sections in equal width with a weight of −1, +3, +5, −7, −7, +5, +3, and −1 in a predetermined range corresponding to said five digital data arranged at an equal interval, and that the eight weight coefficients are set as the multiplicators of said multiplying unit.

6. The oversampling circuit according to claim 5, characterized in that a multiplying process performed by said multiplying unit is realized by adding said digital data to an operation result of an exponentiation of 2 by a bit shift.

7. An oversampling circuit, characterized by comprising:
   a multiplying unit for performing a plurality of multiplying process using plural multiplicators on plural pieces of digital data inputted at a predetermined intervals;
   a plurality of step function generation unit for generating step functions corresponding to each of the plural pieces of digital data using plural of multiplication result obtained by the multiplying unit synchronized with an input timing of each of the plural pieces of digital data;
   an addition unit for performing a process of adding up values of the step functions generated by the plurality of step function generation unit; and
   an integrating unit for performing a digital integrating process plural times on output data from the addition unit,
   characterized in that times of said digital integration is two, and data whose value changes like a quadric function is output from said integrating unit.

8. An oversampling circuit, characterized by comprising:
   a multiplying unit for performing a plurality of multiplying process using plural multiplicators on plural pieces of digital data inputted at a predetermined intervals;
   a plurality of step function generation unit for generating step functions corresponding to each of the plural pieces of digital data using plural of multiplication result obtained by the multiplying unit synchronized with an input timing of each of the plural pieces of digital data;
   an addition unit for performing a process of adding up values of the step functions generated by the plurality of step function generation unit; and
   an integrating unit for performing a digital integrating process plural times on output data from the addition unit,
   characterized in that said digital integration performed by said integrating unit is an operating process of accumulating input data, and n times of an oversampling process is performed by repeatedly performing the operating process n times in one period of inputting the digital data.

9. A digital-to-analog converter, comprising:
   an oversampling circuit, said oversampling circuit characterized by comprising:
   a multiplying unit for performing a plurality of multiplying process using plural multiplicators on plural pieces of digital data inputted at a predetermined intervals;
   a plurality of step function generation unit for generating step functions corresponding to each of the plural pieces of digital data using plural of multiplication result obtained by the multiplying unit synchronized with an input timing of each of the plural pieces of digital data;
   an addition unit for performing a process of adding up values of the step functions generated by the plurality of step function generation unit; and
   an integrating unit for performing a digital integrating process plural times on output data from the addition unit, and
   comprising at a stage subsequent to said oversampling circuit,
   voltage generation unit for generating an analog voltage corresponding to a value of data output by said integrating unit; and
   smoothing unit for smoothing the analog voltage generated by said voltage generation unit.

* * * * *